United States Patent
Tsai et al.

(10) Patent No.: US 6,724,639 B2
(45) Date of Patent: Apr. 20, 2004

(54) POWER SUPPLY STRUCTURE

(75) Inventors: Sheng-Nan Tsai, Taoyuan Hsien (TW); Chen-Chiang Su, Taoyuan Hsien (TW); Jia-Li Tsai, Taoyuan Hsien (TW)

(73) Assignee: Delta Electronics Inc. (TW)

( * ) Notice: Subject to any disclaimer, the term of this patent is extended or adjusted under 35 U.S.C. 154(b) by 0 days.

(21) Appl. No.: 10/198,376

(22) Filed: Jul. 18, 2002

(65) Prior Publication Data

US 2003/0117781 A1 Jun. 26, 2003

(30) Foreign Application Priority Data

Dec. 26, 2001 (TW) .................................... 90222973 U

(51) Int. Cl.7 ..................... H01R 12/16; H05K 1/11; H05K 1/14
(52) U.S. Cl. ................... 361/790; 361/784; 361/785
(58) Field of Search ..................... 361/742, 758, 361/790, 736, 748, 801–804, 770, 784–785; 439/65, 74–75, 76.1; 363/144

(56) References Cited

U.S. PATENT DOCUMENTS 5,575,686 A * 11/1996 Noschese ................. 439/620
5,933,343 A *  8/1999 Lu et al. .................. 363/144

\* cited by examiner

Primary Examiner—Phuong T. Vu
(74) Attorney, Agent, or Firm—Michael Best & Friedrich LLP

(57) ABSTRACT

A power supply structure includes a first circuit board, a second circuit board, a first connecting part and a second connecting part. The second circuit board is horizontally disposed above the first circuit board, a first connecting part electrically connected between the first circuit board and the second circuit board for transmitting signals of the first circuit board and second circuit and a second connecting part electrically connected between the first circuit board and the second circuit board for conducting currents of the first circuit board and the second circuit.

13 Claims, 4 Drawing Sheets

US 6,724,639 B2

POWER SUPPLY STRUCTURE

FIELD OF THE INVENTION

The present invention relates to a power supply, and more particularly to a power supply structure.

BACKGROUND OF THE INVENTION

Referring to FIG. 1, a customarily used power supply structure includes a frame 10 and a circuit board 11, wherein the circuit board 11 is disposed in the frame 10. The circuit board 11 further includes several different devices in response to specifications of different power supplies, wherein a output terminal 12 is electrically connected with one end terminal of the circuit board 11 for outputting sources and signals. In virtue of the miniaturization of electrical devices day by day, the power supply structure disposed in the electrical device has to be reduced in size. However, it is not easy to reduce the occupied space of the circuit board 11 because electrical devices disposed in the power supply are almost in a standard specification. Furthermore, the output terminal 12 is directly connected to the circuit board 11 and occupies more space of the circuit board 11. Hence, the available space of the circuit board 11 becomes narrower and smaller. The space for the original design and the layout of the circuit board can't be used effectively and the entire effects either can't be promoted.

To solve the problem, someone provides electrical devices and output terminals in a small-size specification corresponding to the above power supply of small size, but that will increase a lot of cost. Hence, how to fabricate electrical devices of the existing specification and the circuit board of the existing layout in the finite space without increasing the cost has become one of important targets about the development of the industry.

Therefore, the present invention provides an improved power supply structure for overcoming the problems described above. The power supply structure according to the present invention can be changed for providing proper space for the layouts of several power supplies in different specifications.

SUMMARY OF THE INVENTION

It is one object of the present invention to provide a power supply structure to the above end.

It is another object of the present invention to provide a power supply structure for reducing the complexity of fabrication and the cost.

According to the present invention, a power supply structure comprises a first circuit board, a second circuit board horizontally disposed above the first circuit board, a first connecting part electrically connected between the first circuit board and the second circuit board for transmitting signals of the first circuit board and second circuit board, and a second connecting part electrically connected between the first circuit board and the second circuit board for transferring currents of the first circuit board and second circuit board.

Certainly, the first connecting part can be a connector.

Certainly, the second connecting part can be a conductive column.

Preferably, the conductive column is formed with a copper.

Preferably, the power supply structure further comprises an output terminal disposed below the second circuit board and electrically connected with the second circuit board for outputting the respective current.

Preferably, the power supply structure further comprises a third circuit board horizontally disposed above the second circuit board.

Certainly, the third circuit board can be a control board.

Certainly, the control board can have an electrical device with relatively a high heating power.

Preferably, the control board further comprises a heat sink.

Preferably, the power supply structure further comprises a third connecting part electrically connected between the first circuit board and the third circuit board.

Preferably, the third connecting part is a conductive column for conducting currents of the first circuit board and the third circuit board.

Preferably, the third connecting part is a signal connector for conducting signals of the first circuit board and third circuit board.

Preferably, the power supply structure further comprises a fourth connecting part electrically connected between the second circuit board and the third circuit board.

Certainly, the fourth connecting part can be a conductive column for conducting currents of the second circuit board and the third circuit board.

Certainly, the fourth connecting part can be a signal connector for transmitting signals of the second circuit board and the third circuit board.

Preferably, the third circuit board is disposed above the second circuit board via an upholder.

Now the foregoing and other features and advantages of the present invention will be more clearly understood through the following descriptions with reference to the drawings, wherein:

DETAILED DESCRIPTION OF THE PREFERRED EMBODIMENT

Figure 1:
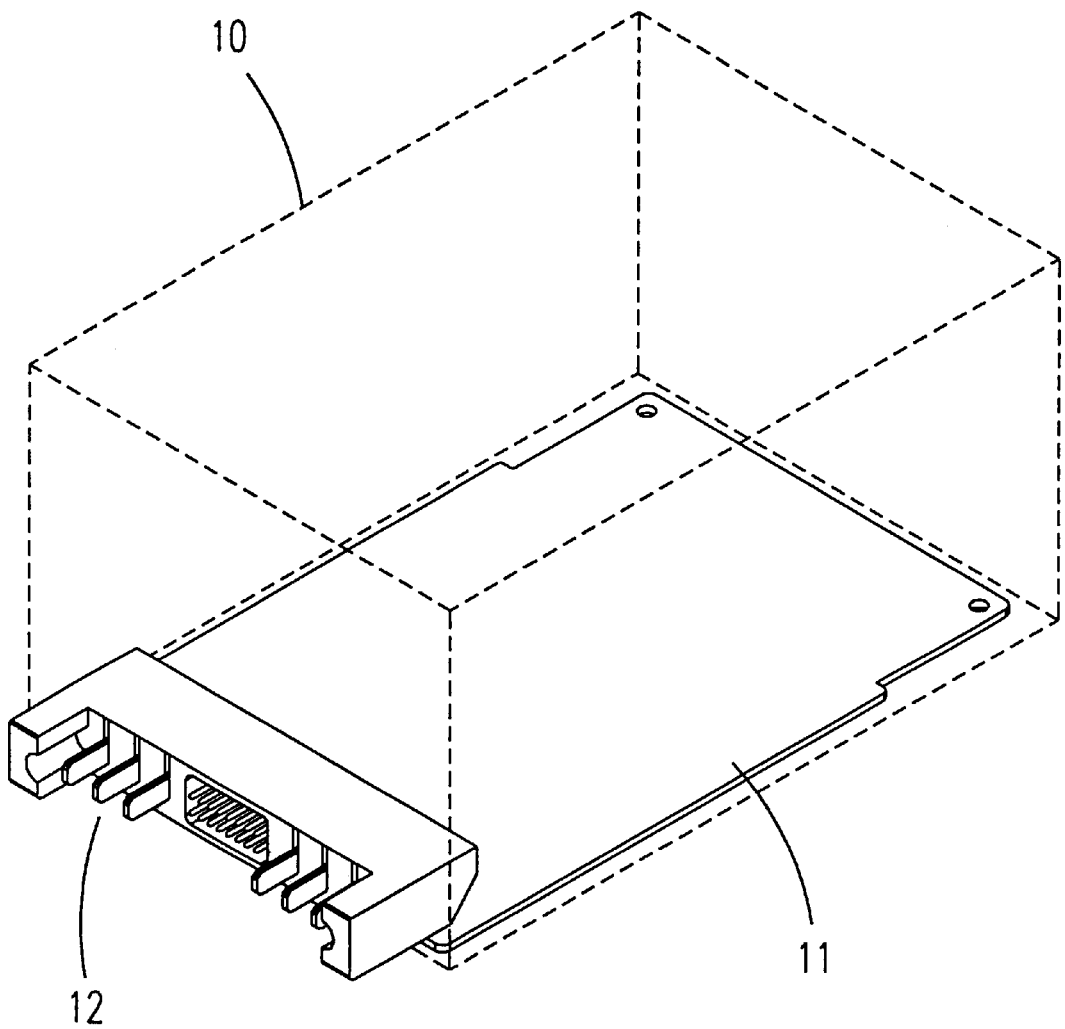
FIG. 1 schematically depicts the power supply structure according to prior art.
Figure 2:
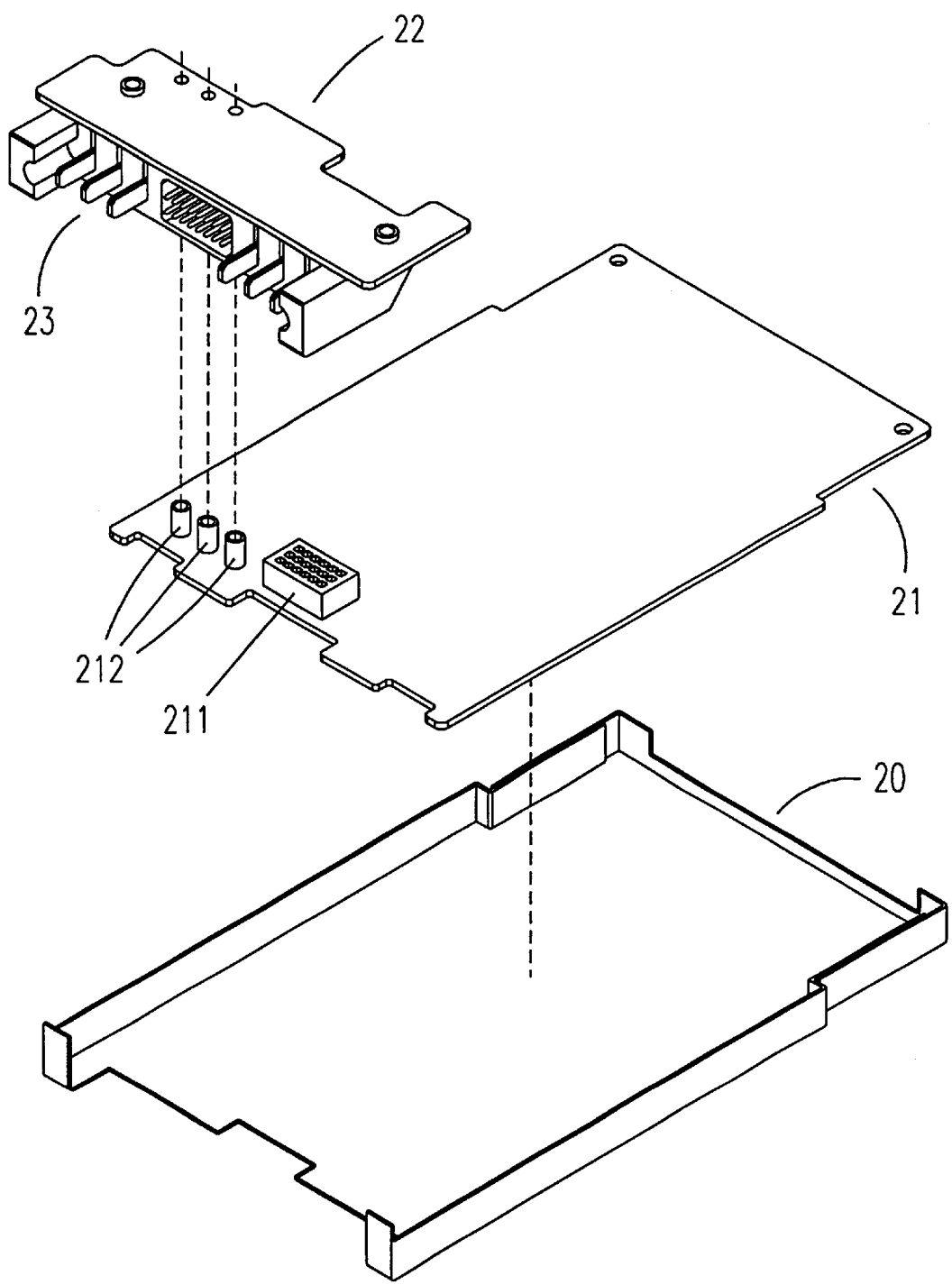
FIG. 2 illustrates a first preferred embodiment of a power supply structure according to the present invention.

Referring to FIG. 2, it illustrates a first preferred embodiment of the power supply according to the present invention. The power supply structure disposed on a frame 20 includes a first circuit board 21, a second circuit board 22 horizontally disposed above the first circuit board 21, a first connecting part 211 electrically connected between the first circuit board 21 and the second circuit board 22 for transferring signals of the first circuit board 21 and second circuit board 22, and a second connecting part 212 electrically connected between the first circuit board 21 and the second circuit board 22 for conducting currents of the first circuit board 21 and second circuit board 22. Wherein the first connecting part 211 is a connector and the second connecting part 212 is a conductive column. The conductive column 212 is formed with copper. The power supply structure further comprises an output terminal 23 disposed below the second circuit board 22 and electrically connected with the second circuit board 22 for outputting the currents and signals. As shown in FIG. 2, the output terminal 23 outputs the currents and signals in the direction parallel to the first circuit board 21 and the second circuit board 22. Thus, a rechangeable fabrication structure designed in response to the disposing space of the power supply is provided.

As shown in FIG. 2, the power supply structure according to the present invention provides an extra disposing space on the second circuit board 22. The output terminal 23 originally occupying the space on the first circuit board 21 can be moved up to the second circuit board 22. Hence, the area of the first circuit board 21 can be reduced. Furthermore, the area of the frame 20 also can be reduced and then the power supply structure achieves the effect of the miniaturization. The total area provided by the power supply is not reduced. On the contrary, the total area will be increased due to the extra space provided by the second circuit board 22. Besides, the signals and the currents can be conducted and transmitted between the first circuit board 21 and the second circuit board 22 through the signal connector 211 and the conductive column 211. The output terminal 23 is disposed below the second circuit board 22 and electrically connected with the second circuit board 22 for outputting the signals and currents. Hence, there is not too much available space occupied by the conduction of the signals and the currents.

Figure 3:
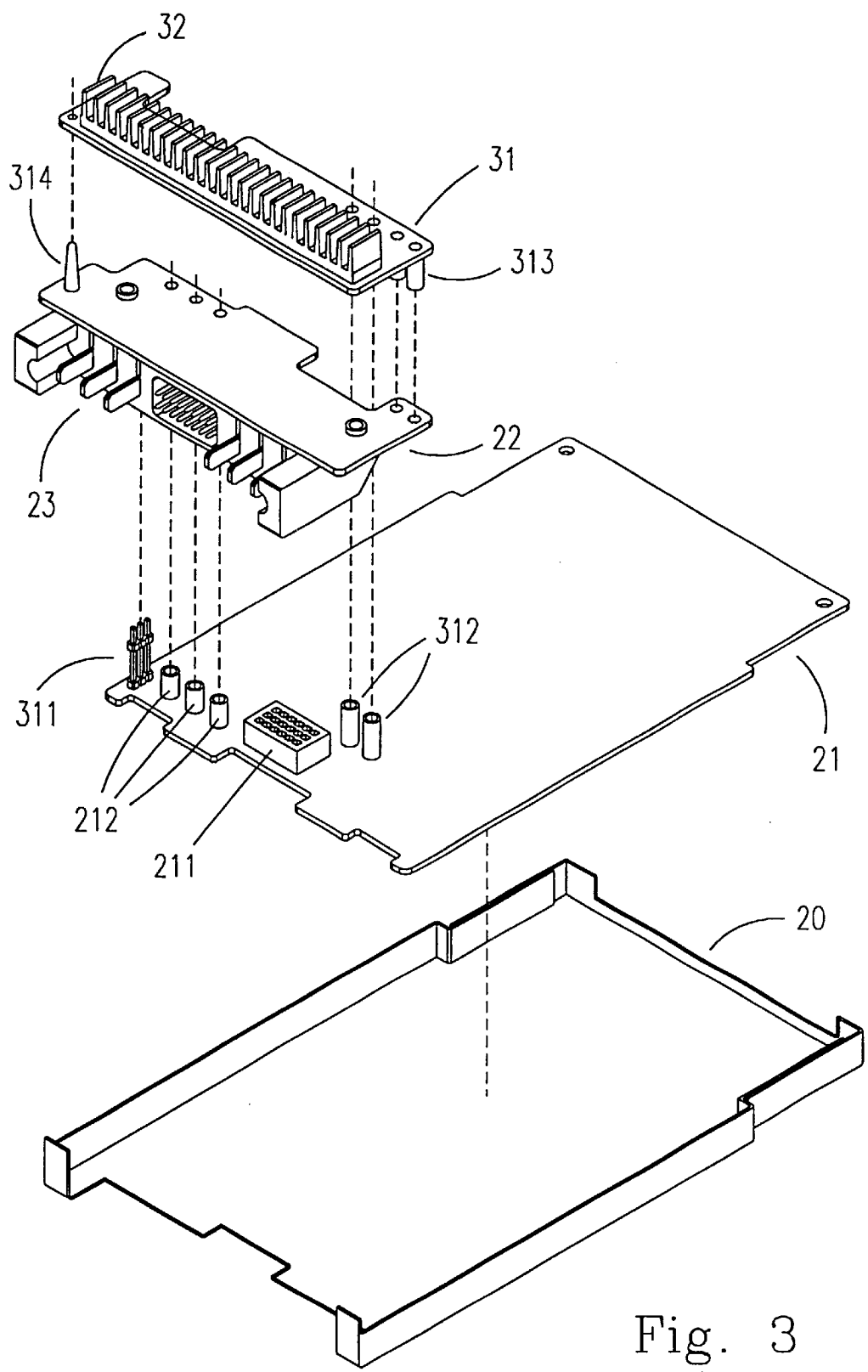
FIG. 3 illustrates a second preferred embodiment of a power supply structure according to the present invention.
Figure 4:
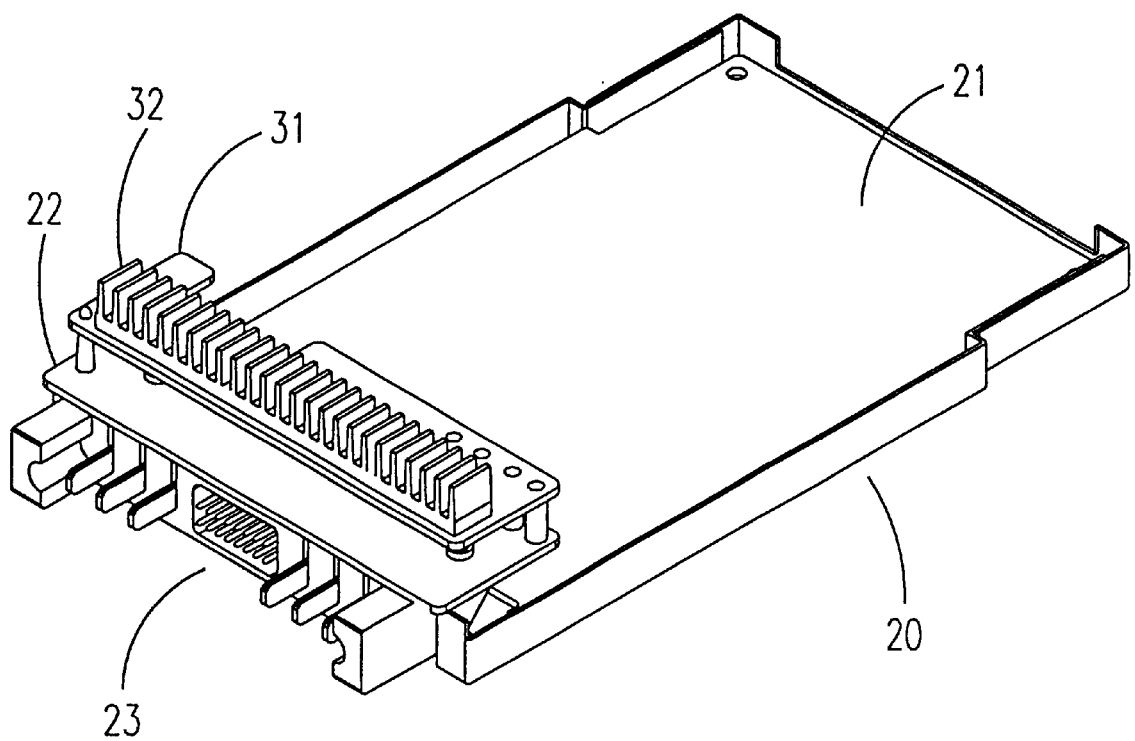
FIG. 4 illustrates the assembly of the second preferred embodiment of a power supply structure according to the present invention.

Referring to FIGS. 3 and 4, they illustrate a second preferred embodiment of a power supply structure according to the present invention. Comparing with the power supply structure in FIG. 2, the power supply structure further provides a third circuit board 31 horizontally disposed above the second circuit board 22 and that will further increase the total useful area of circuit boards. Wherein the third circuit board 31 is a control board having an electrical device with a relatively high heating power. The control board 31 further includes a heat sink 32 for scattering the heat produced by the electrical device with a high heating power. These relative circuit boards of the preferred embodiment of the power supply structure should be disposed anew because the power supply structure includes three circuit boards (21,22 and 23). In this preferred embodiment, the first circuit board 21 and third circuit board 31 are conducted by a third connecting part, wherein the third connecting part has a signal connector 311 and a conductive column 312 respectively transmitting signals and currents of the first circuit board 21 and third circuit board 31. Furthermore, the second circuit board 22 and third circuit board 31 are conducted by a fourth connecting part, wherein the fourth connecting part has a signal connector (not shown) and a conductive column 313 respectively for transmitting signals and currents of the second circuit board 22 and third circuit board 31. The power supply structure provides an upholder 314 disposed between the third circuit board 31 and the second circuit board 22 for keeping the stability between two additional circuit boards.

Accordingly, the present invention provides a power supply structure, which has a lot of advantages including: (1) providing a rechangeable fabrication structure designed in response to the disposing space of the power supply; (2) providing connecting devices which can be changed in response to the requirements of the actual space and electricity; (3) providing the proper space for the layouts of several power supplies in different specifications. Hence, it is clear that the present invention will be desirously applied in the industry.

Although the present invention has been described and illustrated in detail, it is to be clearly understood that the same is by the way of illustration and example only and is not to be taken by way of limitation, the spirit and scope of the present invention being limited only by the terms of the appended claims.

What is claimed is:

1. A power supply structure, comprising:

a first circuit board;

a second circuit board horizontally disposed above said first circuit board;

a first connecting part electrically connected between said first circuit board and said second circuit board for transmitting signals of said first circuit board and second circuit board;

a second connecting part electrically connected between said first circuit board and said second circuit board for conducting currents of said first circuit board and second circuit board;

an output terminal disposed below said second circuit board and electrically connected with said second circuit board for outputting said currents and signals; and a third circuit board horizontally disposed above said second circuit board, wherein said third circuit board is the power supply structure control board.

2. The power supply structure according to claim 1, wherein said first connecting part is a connector.

3. The power supply structure according to claim 1, wherein said second connecting part is a conductive column.

4. The power supply structure according to claim 3, wherein said conductive column is formed with a copper.

5. The power supply structure according to claim 1, wherein said control board has an electrical device with a relatively high heating power.

6. The power supply structure according to claim 1, wherein said control board further comprises a heat sink.

7. The power supply structure according to claim 1 further comprising a third connecting part electrically connected between said first circuit board and said third circuit board.

8. The power supply structure according to claim 7, wherein said third connecting part is a conductive column for conducting currents of said first circuit board and said third circuit board.

9. The power supply structure according to claim 7, wherein said third connecting part is a signal connector for conducting signals of said first circuit board and third circuit board.

10. The power supply structure according to claim 7 further comprising a fourth connecting part electrically connected between said second circuit board and said third circuit board.

11. The power supply structure according to claim 10, wherein said fourth connecting part is a conductive column for conducting currents of said second circuit board and said third circuit board.

12. The power supply structure according to claim 10, wherein said fourth connecting part is a signal connector for transmitting signals of said second circuit board and said third circuit board.

13. The power supply structure according to claim 1, wherein said third circuit board is disposed above said second circuit board via an upholder.

* * * * *